United States Patent
Kuznetsov et al.

(10) Patent No.: US 7,351,293 B2
(45) Date of Patent: Apr. 1, 2008

(54) METHOD AND DEVICE FOR ROTATING A WAFER

(75) Inventors: Vladimir Ivanovich Kuznetsov, Delft (NL); Sijbrand Radelaar, Bilthoven (NL); Jacobus Cornells Gerardus Van Der Sanden, Geldrop (NL); Theo Anjes Maria Ruijl, Bocholtz (NL)

(73) Assignees: ASM International N.V. (NL); Koninklijke Philips Electronics N.V. (NL)

( * ) Notice: Subject to any disclaimer, the term of this patent is extended or adjusted under 35 U.S.C. 154(b) by 473 days.

(21) Appl. No.: 10/969,256

(22) Filed: Oct. 19, 2004

(65) Prior Publication Data

US 2005/0051101 A1 Mar. 10, 2005

Related U.S. Application Data

(62) Division of application No. 09/936,257, filed as application No. PCT/NL00/00154 on Mar. 8, 2000, now Pat. No. 6,824,619.

(51) Int. Cl.
*H01L 21/00* (2006.01)
*C23C 16/00* (2006.01)
*C23C 14/00* (2006.01)

(52) U.S. Cl. ............ 118/730; 118/729; 118/715; 118/725; 118/728; 118/500; 118/52; 156/345.55

(58) Field of Classification Search ............... 118/725, 118/730, 500, 715, 52, 728; 156/345.52, 156/345.51, 345.55
See application file for complete search history.

(56) References Cited

U.S. PATENT DOCUMENTS

| | | | |
|---|---|---|---|
| 3,706,475 A | 12/1972 | Yakubowski | |
| 3,961,120 A | 6/1976 | Hearn et al. | |
| 4,148,575 A | 4/1979 | Siryj | |
| 4,566,726 A | 1/1986 | Correnti et al. | |
| 4,622,918 A | 11/1986 | Bok | |
| 4,738,748 A | 4/1988 | Kisa | |
| 4,828,224 A | 5/1989 | Crabb et al. | |
| 4,860,687 A | 8/1989 | Frijlink | |
| 4,874,273 A | 10/1989 | Tokisue et al. | |
| 4,951,601 A | 8/1990 | Maydan et al. | |
| 4,987,856 A | 1/1991 | Hey et al. | |
| 4,990,047 A | 2/1991 | Wagner et al. | |
| 5,080,549 A | 1/1992 | Goodwin et al. | |
| 5,094,013 A | 3/1992 | Martin et al. | |
| 5,108,513 A | 4/1992 | Muller et al. | |

(Continued)

FOREIGN PATENT DOCUMENTS

DE 3608783 9/1987

(Continued)

*Primary Examiner*—Ram N. Kackar
(74) *Attorney, Agent, or Firm*—Knobbe Martens Olson & Bear LLP

(57) ABSTRACT

Method and device for rotating a wafer which is arranged floating in a reactor. The wafer is treated in a reactor of this nature, and it is important for this treatment to be carried out as uniformly as possible. For this purpose, it is proposed to rotate the wafer by allowing the gas flow to emerge perpendicular to the surface of the wafer and then to impart to this gas a component which is tangential with respect to the wafer, thus generating rotation. This tangential component may be generated by the provision of grooves, which may be of spiral or circular design.

5 Claims, 2 Drawing Sheets

U.S. PATENT DOCUMENTS

| | | |
|---|---|---|
| 5,135,349 A | 8/1992 | Lorenz et al. |
| 5,178,639 A | 1/1993 | Nishi |
| 5,180,273 A | 1/1993 | Sakaya et al. |
| 5,241,758 A | 9/1993 | Cruz et al. |
| 5,281,320 A | 1/1994 | Turner et al. |
| 5,320,982 A | 6/1994 | Tsubone et al. |
| 5,407,449 A | 4/1995 | Zinger |
| 5,445,677 A | 8/1995 | Kawata et al. |
| 5,458,687 A | 10/1995 | Shichida et al. |
| 5,464,313 A | 11/1995 | Ohsawa |
| 5,788,425 A | 8/1998 | Skow et al. |
| 5,855,465 A | 1/1999 | Boitnott et al. |
| 5,855,681 A | 1/1999 | Maydan et al. |
| 5,863,170 A | 1/1999 | Boitnott et al. |
| 5,911,461 A | 6/1999 | Sauter et al. |
| 5,974,682 A | 11/1999 | Akimoto |
| 6,068,089 A | 5/2000 | Brooks et al. |
| 6,073,366 A | 6/2000 | Aswad |
| 6,097,005 A | 8/2000 | Akimoto |
| 6,111,225 A | 8/2000 | Ohkase et al. |
| 6,183,183 B1 | 2/2001 | Goodwin et al. |
| 6,183,565 B1 | 2/2001 | Granneman et al. |
| 6,203,622 B1 | 3/2001 | Halpin et al. |
| 6,209,220 B1 | 4/2001 | Raaijmakers |
| 6,215,106 B1 | 4/2001 | Boas et al. |
| 6,242,718 B1 | 6/2001 | Ferro et al. |
| 6,285,102 B1 | 9/2001 | Matsuoka et al. |
| 6,408,537 B1 | 6/2002 | Aswad |
| 6,443,168 B1 | 9/2002 | Morita et al. |
| 2004/0092128 A1 | 5/2004 | Grant et al. |

FOREIGN PATENT DOCUMENTS

| | | |
|---|---|---|
| EP | 0 829 904 | 3/1998 |
| JP | 63-136532 A | 8/1988 |
| JP | 02053997 | 3/1990 |
| JP | 2001-250788 | 12/2000 |
| WO | WO 90/13687 | 11/1990 |
| WO | WO 98/01890 | 1/1998 |
| WO | WO 99/03138 | 1/1999 |

METHOD AND DEVICE FOR ROTATING A WAFER

REFERENCE TO RELATED APPLICATION

This application is a divisional of U.S. application Ser. No. 09/936,257, filed Jan. 11, 2002, now U.S. Pat. No. 6,824,619, which is the U.S. national phase of International Application No. PCT/NL00/00154, filed Mar. 8, 2000, which claims priority from Netherlands Patent Application No. 1011487, filed Mar. 8, 1999.

FIELD OF THE INVENTION

The present invention relates to a method for rotating a disc-shaped object, such as a wafer, wherein along a side of said object a gas flow is directed, giving a rotation to said object, wherein said gas flow is given the rotation generating component being tangential to said object by a pattern of grooves.

BACKGROUND OF THE INVENTION

Such a method is known from U.S. Pat. No. 3,706,475. In this specification a device is disclosed for transporting wafers. The device comprises an elongated trajectory and from the lower side gas is added in such a way that except from a transferring movement also a rotating movement is given to the wafer.

From US 393068 a method is known for rotating an object such as a wafer from semi conducting material placed in a reactor. During the treatment of a single wafer which is held floating in a reactor, it is important for a treatment of this nature to be carried out as uniformly as possible. For this purpose, it is proposed, in the prior art, to impart a rotational movement to the wafer. This rotational movement is imposed, according to the prior art, by having the gas-introduction openings opening out not perpendicular to the wafer surface, but rather having them end at an acute angle with respect to the wafer surface ("directional air jets"). As a result, a propulsive movement is imparted to the wafer.

However, drilling the gas-introduction openings in this way has proven to be particularly complicated while, in addition, the rotational speed which can be achieved is limited, owing to the fact that the gas which flows out very quickly loses its tangential flow component. Moreover, reactor walls of this nature are complicated to produce, since openings have to be drilled at an angle with respect to the wall.

SUMMARY OF THE INVENTION

The object of the present invention is to avoid these drawbacks while nevertheless maintaining the rotation of the wafer and making it possible, in a relatively inexpensive and simple manner, to impose a rotation of this nature on the wafer.

It is a further aim of the subject invention to accurately position the wafer to realise effective treatment thereof.

This aim is realised with the method as described above in that said object is floatingly received in a compartment being closed on all sides, said object being substantially rotating only and in that along the other side of said object, a further gas flow is directed.

Through the presence of a groove pattern the gas flow is given a component of movement extending tangentially to the wafer, i.e. gives a rotating movement to the wafer. Furthermore, the wafer is subjected from the other side to a further gas flow, so that this is accurately positioned in the reactor. Also the gas flows are controlled and provided such that the wafer substantially only rotates and does not execute a translating movement.

According to a preferred embodiment gas flow is blown in a direction substantially perpendicular to said object from a gas introduction opening in the reactor.

Surprisingly, it has been found that by providing a pattern of grooves it is possible to affect the direction of flow of the gas. The gas will preferably begin to flow in the direction of the groove, since this is the path of least resistance. The gas flow is guided in this way over the entire distance which the groove covers. If the direction of the groove contains a tangential component, a tangential flow component is also imparted to the gas. This tangential flow component imposes rotation on the wafer. Grooves of this nature can be produced relatively easily by milling. The pattern of grooves may have any desired shape. According to an advantageous design, the pattern of grooves is arranged in the shape of a spiral. In this case, the grooves are preferably arranged in such a manner that the spiral starts in the vicinity of the centre of the wafer and ends in the vicinity of the circumferential edge thereof. The desired rotational speed can be set by means of the shape of the spiral grooves. The total quantity of gas supplied to the wafer can therefore be selected independently of the desired rotational speed and can be set in such a manner that optimum axial and radial support and a uniform process result can be obtained. This can be achieved by adapting the shape of the spiral grooves. As a result, it is possible to work with comparatively small quantities of gases, as is desirable in order to maintain the uniformity inside the reactor.

This uniformity can be increased still further by also arranging the openings from which the gases emerge in a spiral pattern. This means that, according to a preferred embodiment, the openings extend essentially perpendicular to the surface of the wafer, but if these openings are joined by an imaginary line, the result is a spiral whose origin preferably also lies in the vicinity of the desired centre of the wafer and whose end lies in the vicinity of the circumferential edge thereof. During rotation, a point on the wafer does not always "see" the same openings arranged in a circle, which in the prior art causes an annular treatment pattern.

The combination of the rotation and the spiral pattern of gas-introduction openings results in a particularly uniform distribution of the treatment gases and a particularly uniform treatment of the wafer surface.

Another possible design of the pattern of grooves consists in constructing this pattern from one or more circle segments. In this case, it is important for a gas-introduction opening to be situated in the vicinity of one of the ends of the groove. In this case too, the gas flow will preferably begin to flow in the direction of the groove. Since the direction of the groove is perfectly tangential, this method of rotational driving has proven particularly effective. Another advantage of this variant is that the rotational driving is virtually independent of the axial bearing of the wafer or, in other words, of the gas flow which keeps the wafer floating. For example, it is possible to increase or interrupt the gas flow for providing the rotational drive, while the gas flow for keeping the wafer floating is maintained at a constant level. As a result, the rotational speed of the wafer changes, while the other conditions in the reactor remain virtually unchanged. Positioning the grooves, which are arranged as circle segments, in the vicinity of the edge of the wafer maximizes the drive moment and the efficiency of the rotational drive. Also arranging a gas-discharge opening in the vicinity of the other end of the groove further increases the efficiency of the rotational drive. The direction of rotation is reversed by reversing the direction of flow of the gas through the rotational drive groove.

According to a further preferred embodiment the gas flow imposing rotation to the wafer is, in the case that the wafer is in horizontal position in the reactor, introduced at the upper side of the wafer. I.e., rotational drive can be realized both from above, from below as well as from both sides.

The invention also relates to a reactor for the floating, rotational treatment of semiconductor wafers, comprising a top part and a bottom part, between which a chamber which accommodates the wafer is delimited, the said top part and bottom part being provided with gas-supply openings, the gas-introduction openings extending essentially perpendicular to the top part and/or bottom part and a pattern of grooves, which imparts to the said gas flow a component which is tangential with respect to the said object, being arranged in at least one of the said parts.

This reactor may be provided with the particular designs described above.

BRIEF DESCRIPTION OF THE DRAWINGS

The invention will be explained in more detail below with reference to an exemplary embodiment which is illustrated in the drawing, in which.

DETAILED DESCRIPTION OF THE PREFERRED EMBODIMENT

Figure 1:
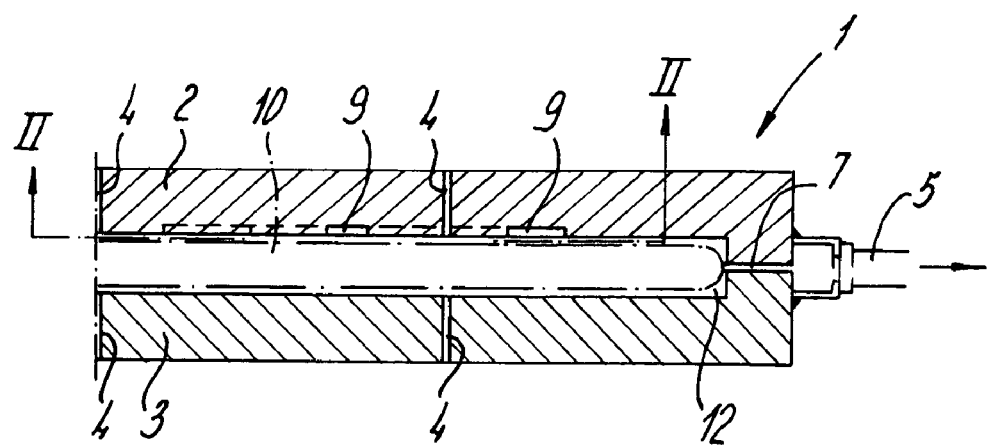
FIG. 1 shows a diagrammatic, sectional view of a reactor which is provided with a wafer arranged floating therein.

In FIG. 1, a reactor is denoted overall by 1. This reactor is shown only in part and comprises a top part 2 and bottom part 3. In any desired way, which is not illustrated, a wafer 10 may be accommodated in the chamber or treatment space 12 delimited between these parts 2 and 3. The treatment gas for the wafer is introduced via gas-introduction openings 4 both above and below the wafer, and this wafer then adopts a floating position. Gas is discharged via discharge openings 7 which may be of any conceivable form and emerge at a circumferential channel 6 which is connected to a discharge line 5.

Figure 2:
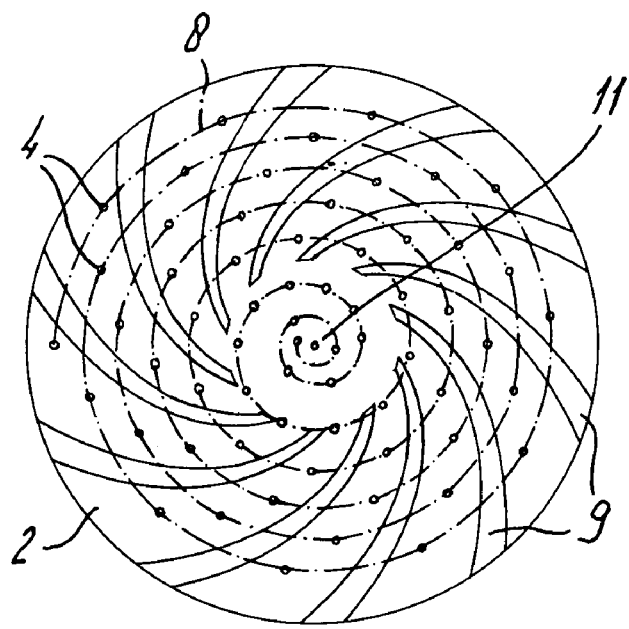
FIG. 2 shows a plan view of the cross section taken on line II-II from FIG. 1.
Figure 3:
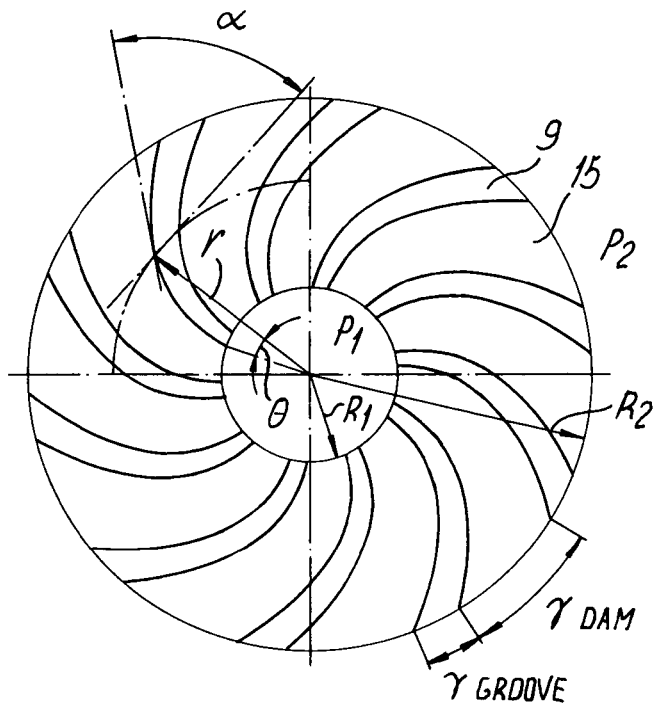
FIG. 3 diagrammatically shows a spiral with a few important parameters.

In order to impart rotation to the wafer, the top part, as can be seen from FIGS. 1 and 2, is provided with a number of grooves 9. These grooves 9 are spiral-shaped, and the origin of the spiral lies in the vicinity of the aimed centre 11 of the wafer 10. The end of the spiral is situated in the vicinity of the circumferential edge of the wafer. Grooves 9 with the shape of a logarithmic spiral are chosen, as illustrated in FIG. 3. In this figure, the grooves are denoted by 9, while the raised part situated between the grooves, which is known as the dam, is denoted by 15; α indicates the groove angle, $\gamma_{groove}$ indicates the groove width, while $\gamma_{dam}$ indicates the dam width. θ represents the spiral angle co-ordinate. P1 is the pressure at the internal diameter and P2 is the pressure at the external diameter. The shape of a logarithmic spiral is described by:

$$r(\theta) = r_1 e^{\theta \tan \alpha}.$$

By way of example, the depth of the grooves is approximately 0.15 mm, and there are ten grooves, with a groove/dam ratio of 1:3 and a groove angle of 42°.

It has been found that a significant fraction of gas leaving the introduction openings 4 moves along these grooves 9 (least resistance), thus imposing rotation on the wafer.

Grooves of this nature may be formed in a subsequent stage, in contrast to the oblique drilled holes.

In order to further ensure the uniformity of the gas supply over the wafer surface, the introduction openings 4 are arranged along an imaginary spiral line 8. The origin of this spiral is likewise situated in the vicinity of the desired centre 11 of the wafer.

By varying the various parameters which determine the shape of the groove, it is possible to control the rotational speed. Some of these factors include the depth of the groove, the groove angle, the groove/dam ratio, the number of grooves, etc. This can be influenced further by effectively positioning the introduction openings 4 with respect to the drive grooves 9.

Tests have shown that with a continuous flow of gas a stable rotation of the corresponding wafer is achieved after approximately 10 seconds starting from an initial situation. Naturally, this too is dependent on the conditions, and this time can be reduced considerably depending on the requirements imposed.

It will be understood that a corresponding design can be arranged on the underside. All this depends on the intended treatment. The speed at which the wafer is rotated is dependent on the process and preferably lies between 2 and 100 rpm.

Figure 4:
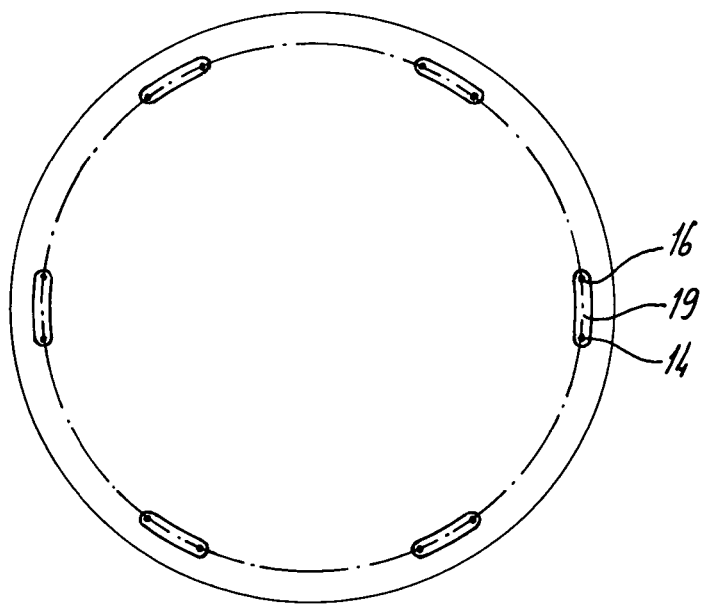
FIG. 4 shows a plan view of a variant of the pattern of grooves according to the invention.

FIG. 4 shows part of a variant of the invention. In this design, there are no spiral-shaped grooves, but rather a number of circle segments 19 which, in the design illustrated in FIG. 4, lie on the same circle. In the design illustrated in that figure, there are also gas-introduction openings 14 and 16.

As in the preceding designs, the openings extend essentially perpendicular to the plane of the drawing. If gas is introduced through openings 14, in the design in accordance with FIG. 4 the rotation will be to the left, while if gas is supplied from the openings 16, rotation will be to the right. The position of the rotational drive grooves is selected to be in the vicinity of the edge of the wafer, since this maximises the drive moment and the efficiency of the driving. The efficiency of the rotational driving can be increased still further by injecting gas in the vicinity of one end of the groove and discharging gas in the vicinity of the other end of the groove.

It should be understood that it is possible to use a number of circle segments of different radii.

Moreover, it is possible to make various gas-introduction openings, optionally in combination with gas-discharge openings, which are likewise situated in the vicinity of the circle segments. Moreover, in the latter case, the direction of flow between gas-introduction opening and gas-discharge opening can be periodically reversed, if desired.

Moreover, it will be understood from the two variant designs shown above, that other groove patterns are possible; all that is important for the invention is that the local depression caused by the grooves imparts a rotation-creating component to the gas which is blown in the perpendicular direction and may be diverted in the horizontal direction before the wafer.

Although the invention is described above with reference to a preferred embodiment, variants which lie within the scope of the appended claims will immediately be obvious to people who are skilled in the art after they have read the above text. Although the invention is described with reference to moving a wafer in a reactor, it can equally well be used for moving any other object in any other type of chamber.

We claim:

1. A method of semiconductor processing, comprising:
   loading a semiconductor wafer into a reaction chamber, at least one of the upper or lower surfaces of the chamber comprising a pattern of grooves and gas inlets, wherein the grooves define a plurality of circle segments;
   wherein the center of the circle is coaxial with a center of the wafer and wherein each of the circle segments has provided in the circle segment a first hole near one end of the circle segment and a second hole arranged near the opposite end of the circle segment;
   floatingly supporting the wafer inside the chamber by streaming gas directly against a bottom of the wafer;
   rotating the floatingly supported wafer by flowing gas directly against the wafer using the first hole of the circle segment as a gas introduction hole and using the second hole of the circle segment as a gas exit hole; and
   reversing a direction of the wafer rotational driving force by using the first hole of the circle segments as a gas exit hole and the second hole of the circle segments as a gas introduction hole.

2. The method of claim 1, wherein the upper surface comprises the pattern of grooves and gas inlets.

3. The method of claim 2, wherein floatingly supporting the wafer comprises streaming gas out of gas holes in the bottom surface.

4. The method of claim 1, wherein rotating the wafer comprises varying a rotational speed of the wafer while maintaining the wafer at a constant vertical height relative to the lower surface.

5. The method of claim 1, wherein the gas inlets are perpendicular to the upper surface.

* * * * *